(12) United States Patent
Oh et al.

(10) Patent No.: US 9,198,291 B2
(45) Date of Patent: Nov. 24, 2015

(54) PLASTIC PANEL AND FLAT PANEL DISPLAY DEVICE USING THE SAME

(71) Applicant: LG DISPLAY CO., LTD., Seoul (KR)

(72) Inventors: ChungWan Oh, Osan-si (KR); HoWon Son, Gumi-si (KR)

(73) Assignee: LG DISPLAY CO., LTD., Seoul (KR)

( * ) Notice: Subject to any disclaimer, the term of this patent is extended or adjusted under 35 U.S.C. 154(b) by 301 days.

(21) Appl. No.: 13/949,768

(22) Filed: Jul. 24, 2013

(65) Prior Publication Data

US 2014/0029230 A1  Jan. 30, 2014

(30) Foreign Application Priority Data

Jul. 25, 2012  (KR) .................. 10-2012-0081071

(51) Int. Cl.
  *G02F 1/133* (2006.01)
  *G09G 3/04* (2006.01)
  *H05K 1/14* (2006.01)
  *G02F 1/1345* (2006.01)
  *G02F 1/1333* (2006.01)
  *G02F 1/1362* (2006.01)

(52) U.S. Cl.
  CPC .............. *H05K 1/14* (2013.01); *G02F 1/13452* (2013.01); *G02F 1/133305* (2013.01); *G02F 2001/136254* (2013.01)

(58) Field of Classification Search
  CPC .............. G02F 1/133348; G02F 1/033; G02F 1/13334; G02F 1/133514; G02F 1/1362; G02F 1/1393; G02F 1/13306

USPC .......................................... 349/31, 33; 345/33
See application file for complete search history.

(56) References Cited

U.S. PATENT DOCUMENTS

| 2005/0211990 | A1 | 9/2005 | Lee et al. | |
| 2006/0082714 | A1* | 4/2006 | Chae et al. | .................... 349/149 |
| 2008/0001892 | A1 | 1/2008 | Kim et al. | |
| 2009/0309477 | A1 | 12/2009 | Bang et al. | |

FOREIGN PATENT DOCUMENTS

| KR | 10-2007-0076068 A | 7/2007 |
| KR | 10-2007-0080379 A | 8/2007 |

* cited by examiner

*Primary Examiner* — Mike Qi
(74) *Attorney, Agent, or Firm* — Birch, Stewart, Kolasch & Birch, LLP (57) ABSTRACT

Discussed is a flat display panel. The flat display panel includes a display area to display an image with a plurality of panel electrodes, and a non-display area. A plurality of link lines connected to the panel electrodes are provided in the non-display area. The display area and the non-display area are provided in a base substrate. A plurality of link pads, electrically connected to the link lines and a plurality of link terminals provided in a driving element, are provided in a bonding part adhered to the driving element in the non-display area. Two resistance pads are respectively connected to two link terminals which are electrically connected to each other through the driving element. At least two pads are respectively connected to the two resistance pads.

17 Claims, 9 Drawing Sheets

FIG. 1

Related Art

FIG. 2

Related Art

PLASTIC PANEL AND FLAT PANEL DISPLAY DEVICE USING THE SAME

CROSS-REFERENCE TO RELATED APPLICATIONS

This application claims priority to and the benefit of the Korean Patent Application No. 10-2012-0081071 filed on Jul. 25, 2012, which is hereby incorporated by reference as if fully set forth herein.

BACKGROUND OF THE INVENTION

1. Field of the Invention

Embodiments of the present invention relate to a display panel applied to flat panel display devices, and particularly, to a plastic panel.

2. Discussion of the Related Art

Flat panel display (FPD) devices are applied to various electronic products such as portable phones, tablet personal computers (PCs), notebook computers, etc.

The FPD devices include liquid crystal display (LCD) devices, plasma display panels (PDPs), organic light emitting diode (OLED) display devices, etc. Recently, electrophoretic display (EPD) devices are widely used as the FPD devices.

Figure 1:
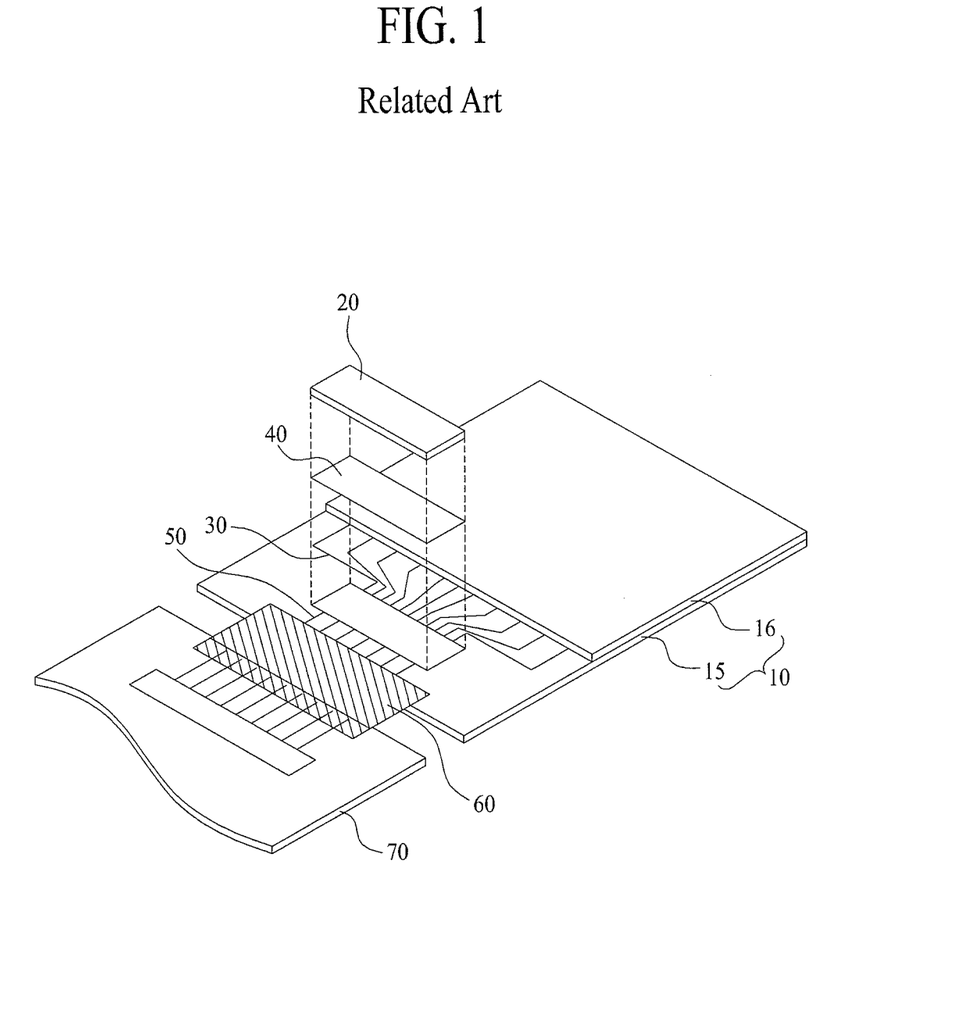
FIG. 1 is a view schematically illustrating a configuration of a related art FPD device.
Figure 2:
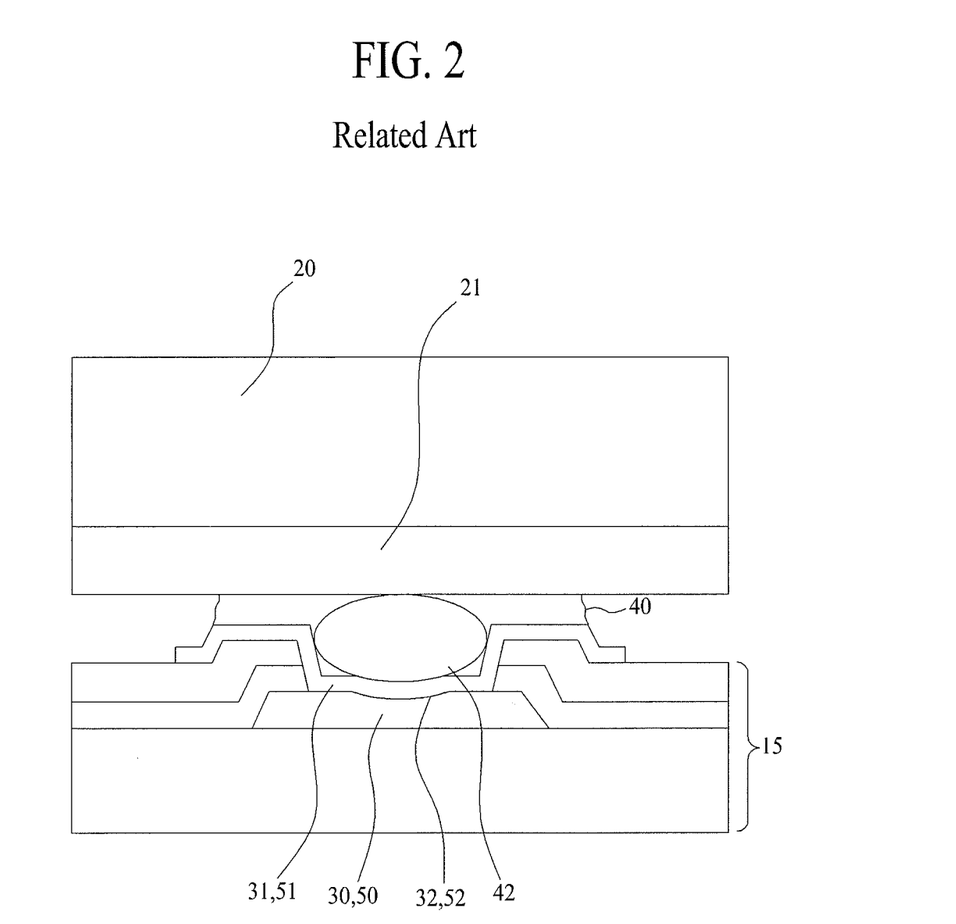
FIG. 2 is a sectional view of an embodiment illustrating a state in which a display panel of FIG. 1 is adhered to a driving IC by a conductive member of a related art.

FIG. 1 is a view schematically illustrating a configuration of a related art FPD device. FIG. 2 is a sectional view of an embodiment illustrating a state in which a display panel of FIG. 1 is adhered to a driving integrated circuit (IC) by a conductive member.

The FPD device, as illustrated in FIG. 1, includes a display panel 10 that displays an image, a printed circuit board (PCB, main board) 70 on which various circuit components are mounted, a flexible printed circuit (FPC) 60 that connects the PCB 70 to the display panel 10, and a driving IC (D-IC) 20 that is mounted on the display panel 10 and drives the display panel 10 according to an electrical signal transferred from the PCB 70 through the FPC 60.

The display panel 10 may use various types of panels, such as a liquid crystal panel, a PDP, an organic light emitting display panel, an EPD panel, etc., depending on the types of the above-described FPD devices. Generally, the display panel 10 is configured with an upper substrate 16 and a lower substrate 15.

The display panel 10 includes a display area that substantially displays an image, and a non-display area that cannot display an image. A plurality of output link lines 30, which electrically link the driving IC 20 to a plurality of panel lines (gate lines or data lines) disposed in the display area, and a plurality of input link lines 50 electrically linking the driving IC 20 to the FPC 60 are arranged in the non-display area.

The driving IC 20 may be a data driver IC for driving the data lines of the display panel 10, a gate driver IC for driving the gate lines of the display panel 10, or a display driver IC (DDI) for integratedly driving the data lines and the gate lines. In FIG. 1, the display driver IC is illustrated as an example of the driving IC 20.

In a chip-on glass (COG) type in which the driving IC 20 is directly mounted on the display panel 10, as illustrated in FIG. 1, when an anisotropic conductive member 40, such as an anisotropic conductive film (ACF), is disposed between the plurality of link lines 30 and 50 and the driving IC 20, by compressing the driving IC 20 to the display panel 10, the driving IC 20 is electrically connected to the link lines 30 and 50.

To this end, as illustrated in FIG. 2, a link terminal (bump) 21 is disposed at one side surface of the driving IC 20 corresponding to the link lines 30 and 50, and thus, when the driving IC 20 is compressed, a lower side surface of the link terminal 21 compresses a conductive ball 42 included in the conductive member 40 and is hardened, thereby electrically linking the link lines 30 and 50 to the driving IC 20. In this instance, a plurality of transparent electrodes 31 and 51 are formed on the link lines 30 and 50, for assisting electrical connections between the link terminal 21 and the link lines 30 and 50.

In this instance, a sufficient number of conductive balls are sufficiently compressed by the link terminal 21 to ensure electrical conductivity between the display panel 10 and the driving IC 20. Therefore, the above-described compression process necessarily needs an operation that tests whether a conductive ball 42 is sufficiently compressed by the link terminal 21.

To this end, a scheme is used in which a microscope is disposed under the display panel 10 so as to check fine indentations 32 and 52 formed on the transparent electrodes 31 and 51 or the link lines 30 and 50 through the display panel 10, and a camera captures images of the indentations 32 and 52 checked by the microscope to acquire image data, thereby testing the indentations 32 and 52 in which the link lines 30 and 50 or the transparent electrodes 31 and 51 are compressed by the dented conductive ball 42. Here, the indentations denote squashed marks that, when the conductive ball 42 is compressed on the link terminal 21 and the display panel 10, are formed on the transparent electrodes 31 and 51 or the link lines 30 and 50 by denting a portion of the conductive ball 42. That is, there being a number of marks squashed by the dented conductive ball (or broken conductive ball) 42 denotes the link lines 30 and 50 being closely adhered to the link terminal 21, and moreover denotes the link terminals 21 being electrically connected to the link lines 30 and 50.

Recently, the use of FPD devices using a plastic panel, which is not damaged even when being folded or rolled, continues to increase.

Especially, e-books which users can carry and use are manufactured with an EPD panel, in consideration of characteristics in which power consumption is low, the cost is low, and the e-book is accommodated and kept in a space with various articles placed therein like bags. The EPD panel is manufactured as a plastic panel.

In addition to the e-books, various electronic products are manufactured with the plastic panel for portability reasons. In addition to the EPD panels, liquid crystal panels, plasma display panels, organic light emitting display panels, etc., may be manufactured as the plastic panel.

Here, the plastic panel denotes a display panel in which a base substrate configuring the display panel 10 is formed of a synthetic resin such as plastic. That is, a base substrate of the plastic panel is a plastic base substrate.

Even when the driving IC 20 is mounted on the plastic panel 10, the above-described conductive ball 42 and compression process are used, and an operation of testing whether the conductive ball 42 included in the conductive member 40 is sufficiently compressed to the link terminal 21 is applied.

However, in the plastic panel 10, it is difficult to visually determine a degree of indentation in which the link lines 30 and 50 are compressed and dented.

Specifically, in the display panel 10 using a glass substrate as a base substrate, degrees of indentations shown through the link lines (metal layers) 30 and 50 or the transparent electrodes 31 and 51 are differently shown depending on a bonding condition between the conductive ball 42 and the link terminal 21, and a COG bonding condition and a degree of indentation are determined by comparing the degrees of indentations. However, in the plastic panel 10, since degrees of indentations based on the COG bonding condition are similar, it is difficult to check a difference between the degrees of indentations.

To provide an additional description, in the plastic panel 10, when the conductive ball 42 is compressed onto the link terminal 21 and the plastic base substrate, the conductive ball 42 is dented or broken and thus stuck into the plastic base substrate through the link lines 30 and 50 without being closely adhered to the link terminal 21 and the plastic base substrate, and thus, the number of dented conductive balls 42 is reduced. For this reason, it is difficult to determine a difference between degrees of indentations using the dented conductive ball 42. Particularly, since the link lines 30 and 50 are formed of opaque metal, in the plastic panel, it is more difficult to determine a degree of broken (a degree of dented) conductive ball 42.

SUMMARY OF THE INVENTION

Accordingly, embodiments of the present invention are directed to provide a flat display panel and a flat panel display device using the same that substantially obviate one or more problems due to limitations and disadvantages of the related art.

An aspect of the present invention is directed to provide a flat display panel and an FPD device using the same, in which two resistance patterns provided in a bonding part are connected to two link terminals that are electrically connected to each other through an internal resistor of a driving element bonded to the bonding part, and connected to two test pads for resistance measurement.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, there is provided a flat display panel including: a display area configured to display an image with a plurality of panel electrodes; and a non-display area, a plurality of link lines connected to the panel electrodes being provided in the non-display area, wherein, the display area and the non-display area are provided in a base substrate, a plurality of link pads, electrically connected to the link lines and a plurality of link terminals provided in a driving element, are provided in a bonding part adhered to the driving element in the non-display area, two resistance pads are respectively connected to two link terminals which are electrically connected to each other through the driving element; and at least two test pads are respectively connected to the two resistance pads.

In another aspect of the present invention, there is provided a flat panel display device including: the flat display panel; and the driving element bonded to the bonding part provided in the flat display panel, wherein, the link terminals included in the driving element are connected to the link pads, the two link terminals of the plurality of link terminals connected to the two resistance pads are electrically connected to each other through an internal resistor of the driving element, the driving element is a flexible printed circuit (FPC) which is bonded to the bonding part at one side of the FPC and bonded to a printed circuit board (PCB) with a driving IC mounted thereon at the other side, and the two test pads are provided in the non-display area of the flat display panel.

It is to be understood that both the foregoing general description and the following detailed description of the embodiments of the present invention are by example and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE EMBODIMENTS

Reference will now be made in detail to the example embodiments of the present invention, examples of which are illustrated in the accompanying drawings. Wherever possible, the same reference numbers will be used throughout the drawings to refer to the same or like parts.

Hereinafter, embodiments of the present invention will be described in detail with reference to the accompanying drawings.

Figure 3:
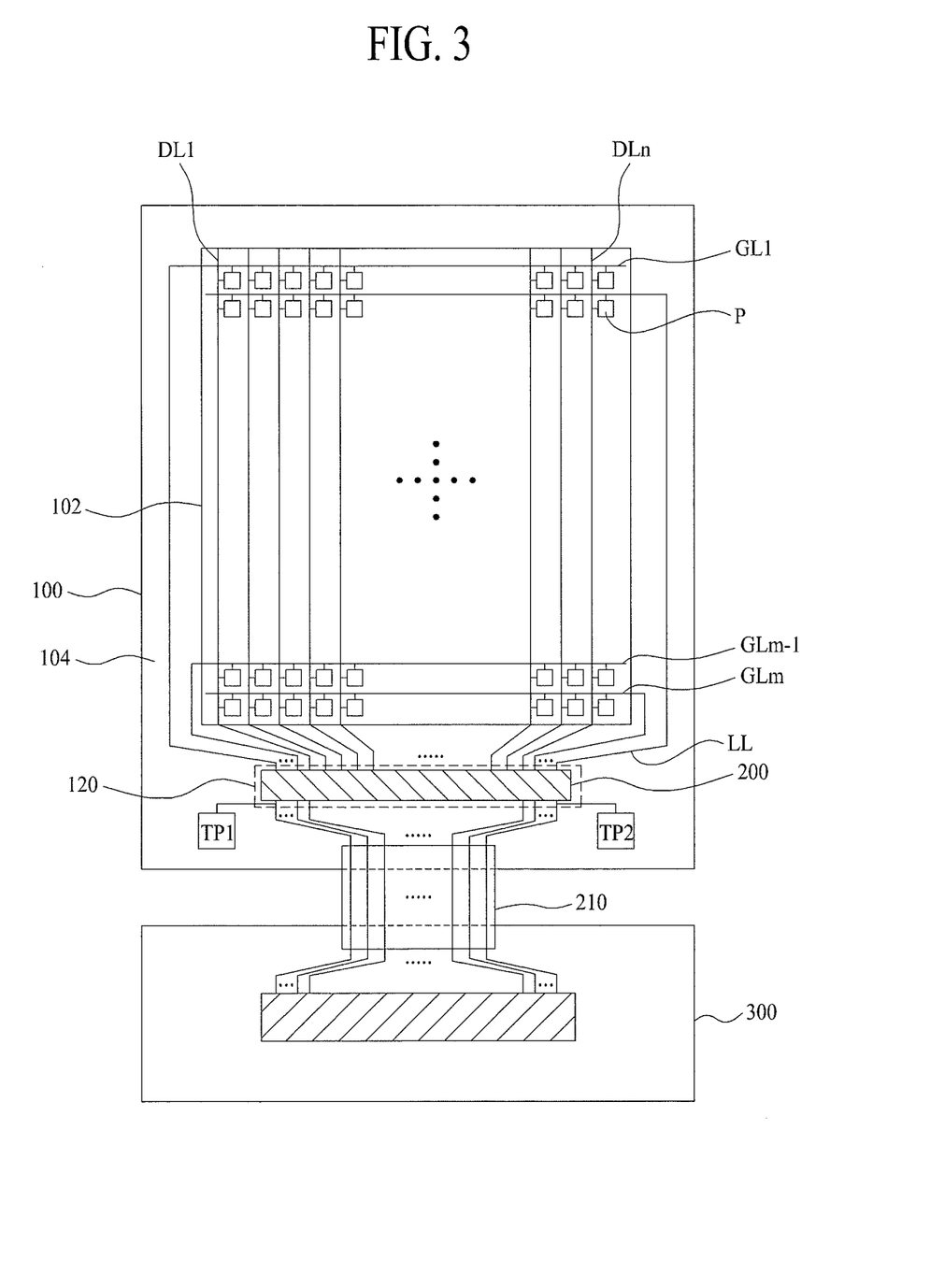
FIG. 3 is a view for schematically describing an FPD device according to a first embodiment of the present invention.
Figure 4:
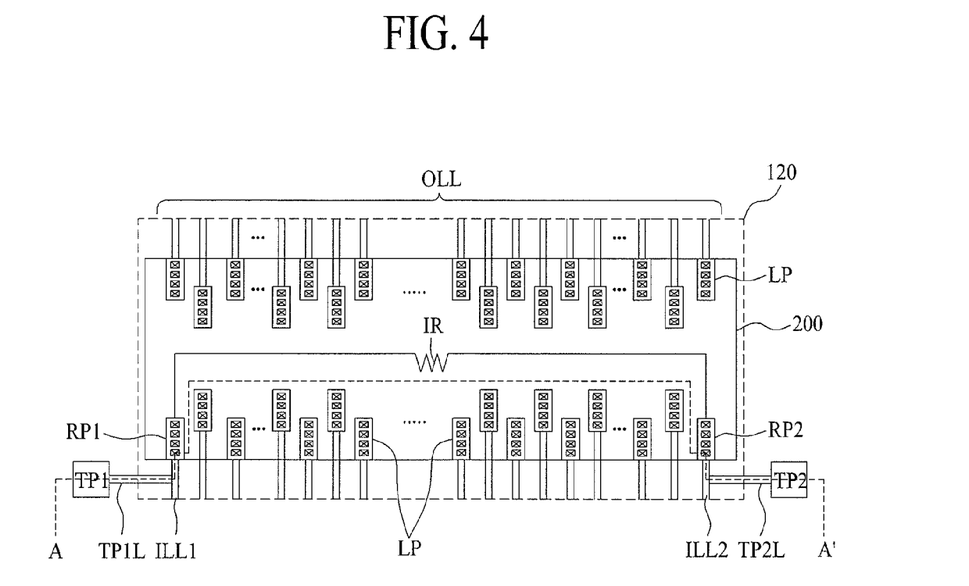
FIG. 4 is a plan view illustrating a state in which a bonding part of a flat display panel is bonded to a driving IC, in the FPD device of FIG. 3 according to the first embodiment of the present invention.
Figure 5:
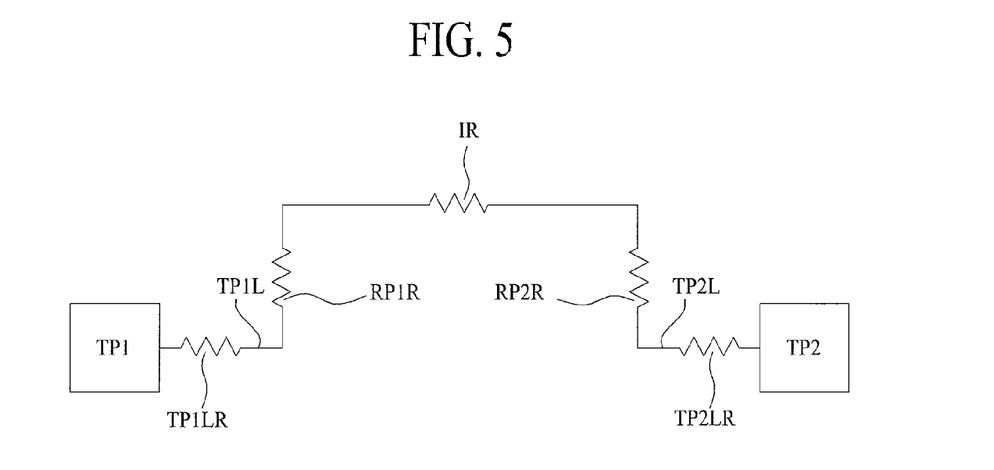
FIG. 5 is an example view illustrating an equivalent circuit of a resistance between first and second test pads TP1 and TP2 of FIG. 4 according to the first embodiment of the present invention.

FIG. 3 is a view for schematically describing an FPD device according to a first embodiment of the present invention. FIG. 4 is a plan view illustrating a state in which a bonding part of a flat display panel is bonded to a driving IC, in the FPD device of FIG. 3. FIG. 5 is an example view illustrating an equivalent circuit of a resistor between first and second test pads TP1 and TP2 of FIG. 4.

The FPD device according to the first embodiment of the present invention, as illustrated in FIG. 3, includes a flat display panel (a panel or a plastic panel) 100, a driving IC 200, an FPC 210, and a PCB (main board) 300. In embodiments of the invention, the panel 100 may be made of plastic or other resin material, which provides flexibility. Accordingly, the panel 100 may be other materials.

First, the plastic panel 100 includes a display area 102 that displays an image, and a non-display area 104 corresponding to an area other than the display area 102. The plastic panel 100 may use various types of panels, such as a liquid crystal panel, a plasma display panel, an organic light emitting display panel, an EPD panel, etc., depending on the types of the above-described FPD devices. Especially, in the plastic panel 100, a base substrate configuring a lower substrate is formed of plastic. That is, the plastic panel 100 according to the present invention is configured as a plastic base substrate.

First, the display area 102 includes a plurality of gate lines GL1 to GLm that are arranged at certain intervals, a plurality of data lines DL1 to DLn that are arranged at certain intervals to intersect the gate lines GL1 to GLm, and a plurality of pixels that are respectively formed in a plurality of areas defined by intersections of the gate lines GL1 to GLm and data lines DL1 to DLn. Hereinafter, a generic name for the plurality of gate lines and the plurality of data lines is simply a panel line (PL).

Each of the pixels P may include a thin film transistor (TFT) connected to one gate line GL and one data line DL. Each pixel P displays an image corresponding to a data signal supplied from the data line DL through the TFT. For example, when the plastic panel 100 is a liquid crystal panel including liquid crystal, each pixel P may be a liquid crystal cell that adjusts a light transmittance of the liquid crystal to display an image according to the data signal supplied from the data line DL through the TFT.

As another example, when the plastic panel 100 is an EPD panel including an electrophoretic film or an e-ink, each pixel P may be a cell that changes positions of electrified particles contained in the electrophoretic film or the e-ink to adjust an amount of reflected light according to a current corresponding to a data signal supplied from a corresponding data line DL through a corresponding TFT, thereby displaying an image.

Second, the non-display area 104 includes a bonding part 120 bonded to the driving IC 200 that supplies a gate signal to the gate lines GL and supplies data signals, synchronized with the gate signal, to the data lines DL. A plurality of link lines LL, which link the panel lines arranged in the display area 102 to a bonding part 120, are arranged in the non-display area 104. The link lines LL may be categorized into a plurality of output link lines OLL and a plurality of input link lines ILL depending on a disposed position with respect to the driving IC 200. For example, in FIG. 4, a plurality of link lines arranged at a lower end of the driving IC 200 electrically link the FPC 210 to the driving IC 200. The link lines input signals, transferred from the FPC 210, to the driving IC 200, and thus, hereinafter, each of the link lines is referred to as an input link line ILL. In FIG. 4, a plurality of link lines arranged at an upper end of the driving IC 200 apply signals, output from the driving IC 200, to the panel lines, and thus, hereinafter, each of the link lines is referred to as an output link line OLL. However, in the embodiment of the present invention, differentiating the input link line ILL and the output link line OLL has no practical benefit. Therefore, in the following description, a generic name for the input link lines ILL and the output link lines OLL is referred to as a link line, except an instance in which it is required to differentiate the input link lines ILL and the output link lines OLL.

Third, as illustrated in FIG. 4, a plurality of link patterns (or link pads) LP electrically connected to the link lines and at least one or more test patterns TP, which are not electrically connected to the link lines, are provided in the bonding part 120 provided in the non-display area 104. The link patterns LP are electrically connected to the link lines LL, and may be provided in a structure of a link pattern that is generally provided in a display panel at the present. That is, the link pattern LP may be variously provided depending on a structure of panel lines arranged in the display area and a structure of link lines arranged in the non-display area.

In FIG. 4, it is illustrated that only two link patterns provided in the center of the bonding part are referred to by reference numeral LP, but all patterns provided in the bonding part 120 are link patterns. The link patterns LP may be connected to the output link lines OLL in one-to-one correspondence relationship, or connected to the input link lines ILL in one-to-one correspondence relationship.

Moreover, in FIG. 4, a plurality of link terminals that are overlappingly bonded to the link patterns LP through a conductive member are provided under the driving IC 200 by the number of link patterns LP.

Moreover, hereinafter, among the link patterns LP illustrated in FIG. 4, especially, two link patterns connected to two link terminals (which are electrically connected to each other through an internal resistor IR of the driving IC 200) are referred to as resistance patterns (or resistance pads). That is, in FIG. 4, a first link terminal connected to a first resistance pattern RP1 connected to a first input link line ILL1 (hereinafter referred to as a first link line) of a plurality of the input link lines ILL is connected to a second link terminal connected to a second resistance pattern RP2 connected to a second input link line ILL2 (hereinafter referred to as a second link line) of the input link lines ILL, through the internal resistor IR of the driving IC 200. In this instance, one of the first link terminal or the second link terminal may be a ground terminal.

A first test pad line TP1L branches from the first link line ILL1 connected to the first resistance pattern RP1, and a first test pad (a first test pattern) TP1 is connected to a distal end of the first test pad line TP1L. A second test pad line TP2L branches from the second link line ILL2 connected to the second resistance pattern RP2, and a second test pad (a second test pattern) TP2 is connected to a distal end of the second test pad line TP2L.

Here, when a resistance measurement terminal contacts the first test pad TP1 and the second test pad TP2, a resistance is measured between the first test pad TP1, the first resistance pattern RP1 connected to the first test pad TP1, the second resistance pattern RP2 electrically connected to the first resistance pattern RP1 through the internal resistor IR, and the second test pad TP2 connected to the second resistance pattern RP2. The measured resistance is illustrated as an equivalent circuit of FIG. 5. That is, a first test pad line resistor TP1LR is disposed on the first test pad line TP1L connected to the first test pad TP1, a first resistance pattern resistor RP1R is disposed at a bonding portion between the first resistance pattern RP1 and the first link terminal, the internal resistor IR is disposed between the first and second link terminals in the driving IC 200, a second resistance pattern resistor RP2R is disposed at a bonding portion between the second link terminal and the second resistance pattern RP2, and a second test pad line resistor TP2LR is disposed at the second test pad line TP2L connecting the second resistance pattern RP2 to the second test pad TP2.

Here, the internal resistor IR of the driving IC 200 may be set to a certain value, and moreover, each of the first and second test pad line resistors TP1LR and TP2LR may be set to a certain value when a thickness, length, and component of each of the first and second test pad lines TP1L and TP2L are set.

The first and second resistance pattern resistors RP1R and RP2R may vary according to an electrical connection state between a plurality of conductive balls included in the conductive member that electrically connects the link terminals of the driving IC 200 to the link patterns LP (including the first and second resistance pattern resistors RP1R and RP2R) provided in the bonding part 120.

Specifically, when the link terminals is closely bonded to the link patterns with the conductive balls therebetween, each of the first and second resistance pattern resistors RP1R and RP2R has a low value because the conductive balls are closely adhered between the first resistance pattern RP1 and the first link terminal and between the second resistance pattern RP2 and the second link terminal. However, when the link terminals is bonded to the link patterns with the conductive balls therebetween with the link terminals not being closely adhered to the link patterns, each of the first and second resistance pattern resistors RP1R and RP2R has a high value because the conductive balls are not closely adhered between the first resistance pattern RP1 and the first link terminal and between the second resistance pattern RP2 and the second link terminal. The first and second resistance pattern resistors RP1R and RP2R can match a degree of indentation that appears in each of the link patterns due to the conductive balls.

Therefore, by measuring a resistance between the first and second test pads TP1 and TP2, a degree of indentation of the conductive ball between the first resistance pattern RP1 and the first link terminal and a degree of indentation of the conductive ball between the second resistance pattern RP1 and the second link terminal may be measured. The measured degrees of indentations are used as data for determining a degree of bonding of the link patterns LP provided in the bonding part 120.

In other words, by measuring the resistance between the first and second test pads TP1 and TP2, a degree of indentation between the first resistance pattern RP1 and the first link terminal and a degree of indentation between the second resistance pattern RP1 and the second link terminal may be determined, and a degree of bonding between the link patterns and the link terminals of the driving IC 200 may be determined based on the determined degrees of indentations. The degree of bonding may be used as data for determining whether the driving IC 200 is normally bonded to the bonding part 120. In order for the determination to be substantially applied to a manufacturing process, it is required to build a database of data obtained through a plurality of tests. In the database, degrees of indentations are respectively mapped to resistance levels between the first and second test pads TP1 and TP2.

Hereinafter, structures of the above-described resistance pattern RP, test pad TP, and plastic panel 100 will be described with reference to FIG. 6.

The driving IC 200 is for applying electrical signals to the panel lines provided in the display area, and may be configured in various types.

The driving IC 200 may be a data driver IC for driving the data lines of the display panel 100, a gate driver IC for driving the gate lines of the display panel 100, or a display driver IC (DDI) for integratedly driving the data lines and the gate lines. In FIG. 3, the display driver IC is illustrated as an example of the driving IC 200.

That is, the driving IC 200 adhered to the plastic panel according to the embodiment of the present invention may be at least one of the data driver IC, the gate driver IC, and the display driver IC.

The link terminal (link bump) connected to the link pattern LP is provided in plurality in the driving IC 200, and, among the link terminals, the first and second link terminals respectively connected to the first and second resistance patterns RP1 and RP2 are electrically connected to each other through the internal resistor IR of the driving IC 200. In FIG. 4, it is illustrated that the first and second resistance patterns RP1 and RP2 are respectively provided at left and right sides, but the embodiment of the present invention is not limited to the structure. That is, positions of the first and second resistance patterns RP1 and RP2 may be variously changed depending on positions of the two link terminals connected by the internal resistor IR in the driving IC 200.

The FPC 210 connects the PCB 300, used as the main board, to the plastic panel 100. The FPC 210 can be naturally bent, and thus, when the PCB 300 connected to the FPC 210 is assembled as a display module together with the plastic panel 100, the FPC 210 may be disposed at a bottom of the plastic panel 100.

A link pattern connected to the link terminals provided in the FPC 210 is provided at each of distal ends of the input link lines ILL.

Finally, the PCB 300 is an element that applies electrical signals to the driving IC 200, and is equally called the main board.

Figure 6:
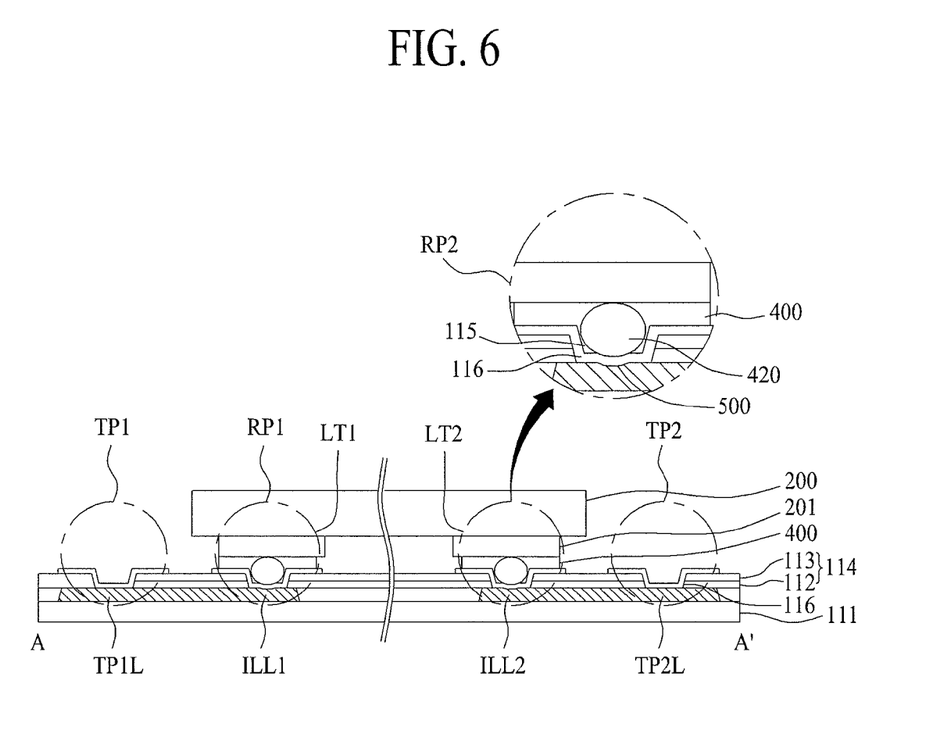
FIG. 6 is a sectional view illustrating a connection state between the driving IC and a test pad of the flat display panel applied to the FPD device according to the first embodiment of the present invention.

FIG. 6 is a sectional view illustrating a connection state between the driving IC and a test pad of the plastic panel applied to the FPD device according to the first embodiment of the present invention. That is, FIG. 6 is an example view illustrating a sectional view taken along line A-A' of FIG. 4. Although only the first and second resistance patterns RP1 and RP2 among the link patterns LP are illustrated in FIG. 6, the link patterns other than the first and second resistance patterns RP1 and RP2 are also configured in the same type as the first and second resistance patterns RP1 and RP2. Therefore, in the following description, a description on the first and second resistance patterns RP1 and RP2 may be applied to all of the other link patterns.

A method of manufacturing the plastic panel 100 applied to the FPD device according to the first embodiment of the present invention and a configuration of the plastic panel 100 will now be described in detail.

First, as illustrated in FIG. 6, a metal layer configuring the first link line ILL1 and the first test pad line TP1L, a metal layer configuring the second link line ILL2 and the second test pad line TP2L, and a metal layer configuring the link lines connected to the respective link patterns LP are stacked on a plastic base substrate 111.

An insulating layer 114 is stacked on the plastic base substrate 111 including a metal layer.

A plurality of via holes 115 are formed at respective positions of the insulating layer 114, in which the first and second resistance patterns RP1 and RP2 and the test pads TP1 and TP2 will be provided, to expose the respective metal layers.

A transparent electrode 116 connected to the metal layer is stacked in each of the via holes 115.

A conductive member 400 is applied onto the via holes 115, formed in the first and second resistance patterns RP1 and RP2, and upper ends of the via holes 115. That is, the conductive member 400 is applied onto portions of the bonding part 120 bonded to link terminals LT1 and LT2 of the driving IC 200.

Finally, the driving IC 200 is disposed on the conductive member 400 applied onto the bonding part 120, and, by applying a pressure to the driving IC 200, conductive balls 420 (inserted into the via holes 115) inside the conductive member 400 are closely adhered to the respective transparent electrodes 116 by the pressure applied to the driving IC 200, and then contact the respective transparent electrodes 116 provided in the first and second resistance patterns RP1 and RP2. Therefore, the link lines (metal layers) of the first and second resistance patterns RP1 and RP2 are electrically connected to the link terminals LT1 and LT2 provided in the driving IC 200.

In the above-described plastic panel, the two test pads TP1 and TP2 branch from the respective link lines connected to the resistance patterns RP1 and RP2, and each of the test pads TP1 and TP2 includes a test pad line provided in the plastic base substrate and a test pad transparent electrode 116 which is connected to the test pad line through the test pad via hole 115 formed in the insulating layer 114 deposited on the test pad line. Here, the test pad line denotes one end of the metal layer, which configures the first test pad line TP1L or the second test pad line TP2L. The other end of the metal layer configures the first link line ILL1 or the second link line ILL2.

In the above-described plastic panel, each of the first and second resistance patterns RP1 and RP2 includes a link line configured by the other end of the metal layer and a link line transparent electrode 116 which is connected to the link line through the link line via hole 115 formed in the insulating layer 114 deposited on the link line.

As described above, the first and second resistance patterns RP1 and RP2 and the test pads TP1 and TP2 are provided in the same type. That is, the resistance patterns and the test pads are configured with the metal layer (link line and test pad line) stacked on the plastic base substrate 111, the insulating layer 114 covering the metal layer, the via hole (link line via hole and test pad via hole) 115 which is formed to expose the metal layer, and the transparent electrode (link line transparent electrode and test pad transparent electrode) 116 stacked in the via hole 115. Each of the link patterns except the first and second resistance patterns RP1 and RP2 singly includes the metal layer used as the link line ILL or OLL, but the first resistance pattern RP1 and the first test pad TP1 share one metal layer and the second resistance pattern RP2 and the second test pad TP2 also share one metal layer.

To provide a more detailed description, the first test pad TP1 is provided at a distal end of the first test pattern line TP1L branching from the metal layer (first link line ILL1) formed in the first resistance pattern RP1, and the second test pad TP2 is provided at a distal end of the second test pattern line TP2L branching from the metal layer (second link line ILL2) formed in the second resistance pattern RP2.

In the above-described configuration, the insulating layer 114 may include a metal insulating layer 112 for insulating the metal layer (which is stacked on the plastic base substrate 111 used as a base substrate of the plastic panel 100 according to the embodiment of the present invention) from other semiconductor layers stacked on the metal (first and second test pad lines ILL1 and ILL2 and link lines ILL1 and ILL2), and a passivation layer 113 for protecting various semiconductor layers formed on the metal insulating layer 112.

An ACF may be applied as the conductive member 400. The conductive member 400 includes a plurality of conductive balls 420 having a characteristic that is broken or dented by being squashed (indented or dimpled).

The conductive member 400 is for bonding the link terminals LT1 and LT2, provided in the driving IC 200 for applying electrical signals to the link lines LL, to the resistance pattern, and includes a plurality of conductive balls 420. An indentation 500 is formed in the link line transparent electrode 116 by the squash of each of the conductive balls 420.

The transparent electrode 116 may be formed of one transparent material of ZnO, ZnO:B, ZnO:Al, SnO2, SnO2:F, indium tin oxide (ITO), indium zinc oxide (IZO), indium tin zinc oxide (ITZO), zinc tin oxide (ZTO), and antimony tin oxide (ATO).

In the above-described configuration, the link terminals LT1 and LT2 of the driving IC 200 are bonded to the resistance patterns RP1 and RP2 with the conductive balls 420 of the conductive member (ACF) 400. For example, when the conductive member 400 including the conductive balls 420 is applied onto the test pattern TP, some of the conductive balls 420 are inserted into corresponding via holes 115 and applied onto the transparent electrodes 116. In this state, the link terminals are bonded to the resistance patterns RP1 and RP2 by thermally pressurizing the driving IC 200. Thus, the indentations 500 are formed by the squash of the dented conductive balls 420, on the transparent electrodes 116 formed in the via holes 115 configuring the resistance patterns RP1 and RP2. Further, the indentation 500 may be formed even at a surface of the transparent electrode 116 formed outside the via hole 115.

Here, the indentation denote a squashed mark that, when the conductive balls 420 are compressed on the link terminals LT1 and LT2 and the transparent electrodes 116 of the resistance patterns RP1 and RP2, is formed on the transparent electrode or the link line by denting a portion of each of the conductive balls 420.

The indentation 500 of the dented conductive ball 420 formed on the transparent electrode 116 enables a test, which is performed by an optical method after bonding of the driving IC 200, for a connection state between the plastic panel 100 and the link terminals of the driving IC 200.

However, in the plastic panel 100, since the metal layer configuring the link line is opaque, the indentation is not viewed well, and, since a difference between degrees of indentations is small, it is difficult to determine degrees of indentations of the driving IC 200 and bonding part 120 by using the difference.

Therefore, as described above with reference to FIGS. 4 and 5, when the driving IC 200 is bonded to the bonding part 120, by measuring a resistance between the first and second test pads TP1 and TP2, a test for a connection state between the link terminals of the driving IC 200 is performed.

Figure 7:
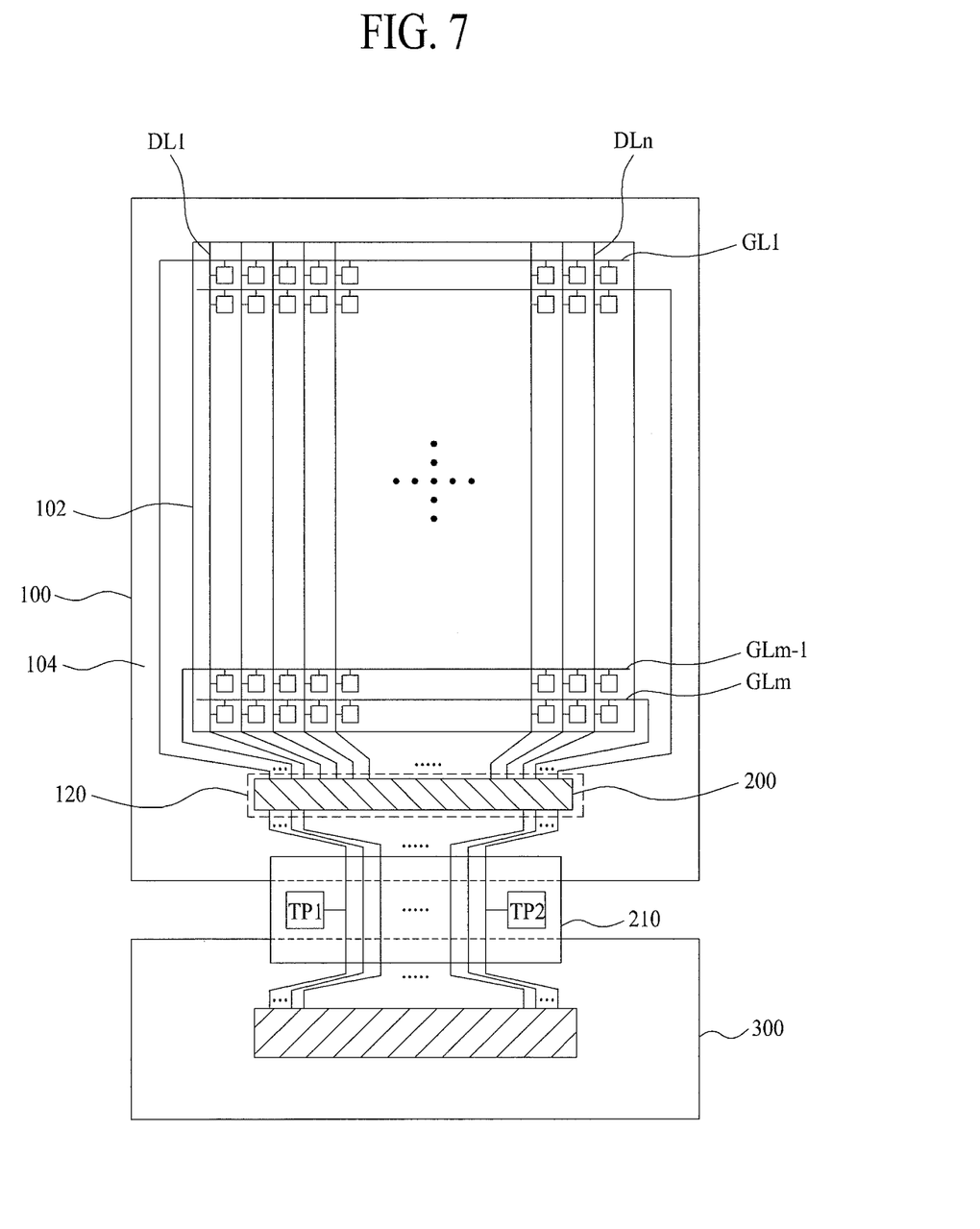
FIGS. 7 and 8 are views illustrating modification examples of the FPD device according to the first embodiment of the present invention illustrated in FIG. 3.
Figure 8:
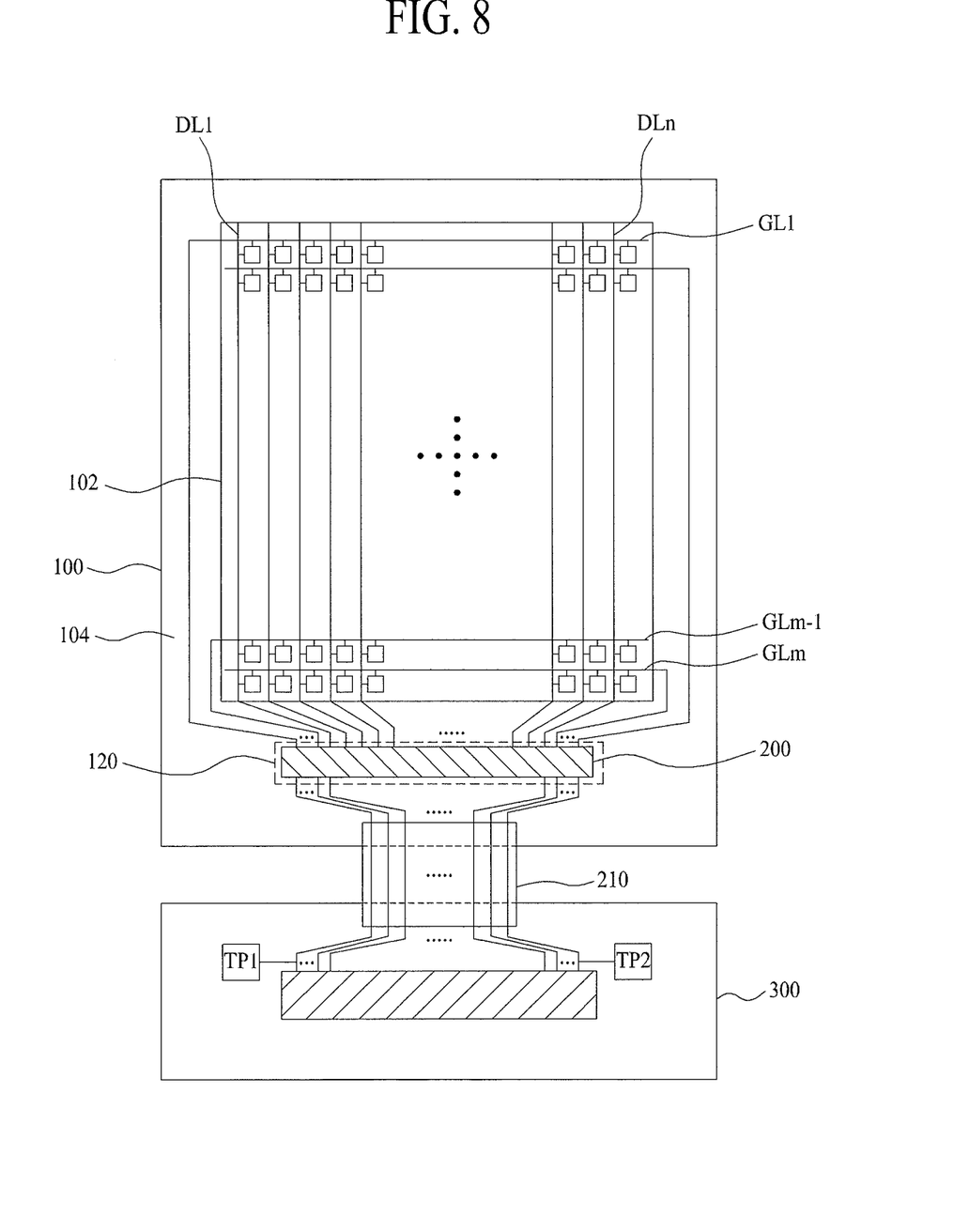

FIGS. 7 and 8 are views illustrating modification examples of the FPD device according to the first embodiment of the present invention illustrated in FIG. 3.

First, the FPD device of FIG. 7 includes the first and second test pads TP1 and TP2 provided in the FPC 210 instead of the plastic panel 100.

Specifically, in the FPD device according to the embodiment of the present invention, when the driving IC 200 is mounted on the plastic panel 100 and the driving IC 200 is connected to the FPC 210, the first and second test pads TP1 and TP2 provided in the FPC 210 are connected to the first and second link terminals LT1 and LT2 of the driving IC 200 bonded to the bonding part 120.

In this instance, resistors between the first and second test pads TP1 and TP2 may further include a resistor on an electrical line provided in the FPC 210, in addition to the resistors described above with reference to FIG. 5. However, the resistor on the electrical line may also be set to a certain value.

Therefore, a level of a connection state between the link terminals LT and link patterns LP of the driving IC 200 may be determined by measuring a resistance between the first and second test pads TP1 and TP2 provided in the FPC 210.

The FPD device of FIG. 8 includes the first and second test pads TP1 and TP2 provided in the PCB 300 instead of the plastic panel 100.

Specifically, in the FPD device according to the embodiment of the present invention, when the driving IC 200 is mounted on the plastic panel 100, the driving IC 200 is connected to the FPC 210, and the FPC 210 is connected to the PCB 300, the first and second test pads TP1 and TP2 provided in the PCB 300 are connected to the first and second link terminals LT1 and LT2 of the driving IC 200 bonded to the bonding part 120.

In this instance, resistors between the first and second test pads TP1 and TP2 may further include the resistor on the electrical line provided in the FPC 210 and a resistor on an electrical line provided in the PCB 300, in addition to the resistors described above with reference to FIG. 5. However, the respective resistors on the electrical lines may also be set to a certain value.

Therefore, a level of a connection state between the link terminals LT and link patterns LP of the driving IC 200 may be determined by measuring a resistance between the first and second test pads TP1 and TP2 provided in the FPC 210.

Figure 9:
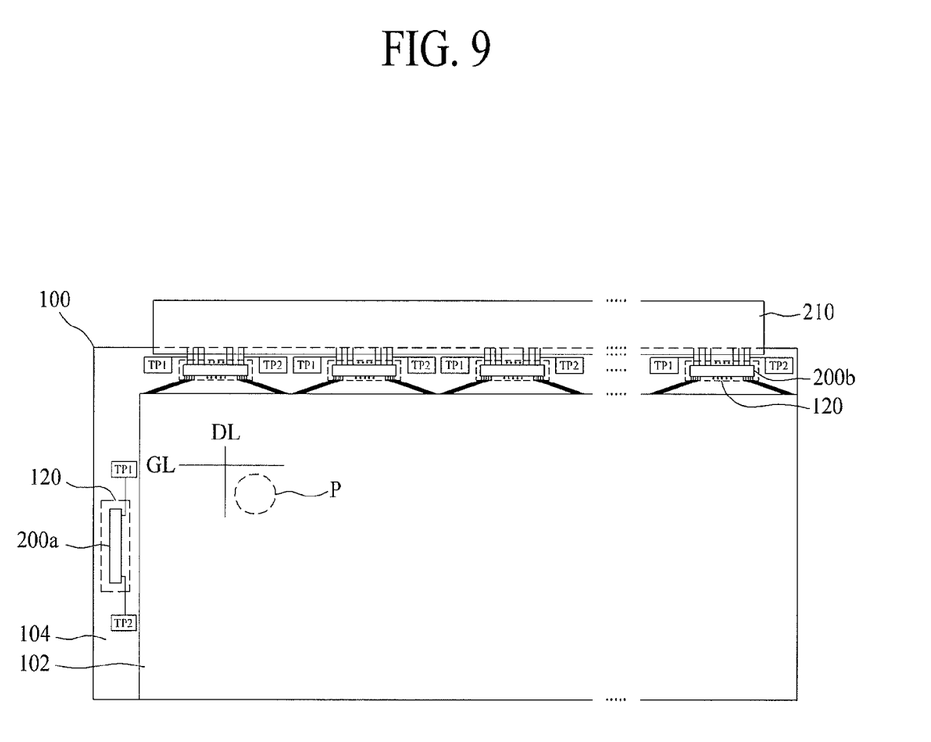
FIG. 9 is a view for schematically describing an FPD device according to a second embodiment of the present invention.

FIG. 9 is a view for schematically describing an FPD device according to a second embodiment of the present invention. In the following description, a description identical or similar to the first embodiment of the present invention described above with reference to FIGS. 3 to 8 is not provided or will only be briefly made.

The FPD device according to the second embodiment of the present invention includes a plastic panel 100, at least one or more gate driver ICs 200a, at least one or more data driver ICs 200b, and an FPC 210.

The FPC 210 may perform only a link function that links the data driver IC 200b to a PCB (main board, not shown) similarly to the FPC 210 of FIG. 3, or act as the main board on which elements, such as a timing controller, are mounted.

The plastic panel 100 includes a display area 102 that displays an image, and a non-display area 104 corresponding to an area other than the display area 102.

The display area 102 includes a plurality of gate lines GL that are arranged at certain intervals, a plurality of data lines DL that are arranged at certain intervals to intersect the gate lines GL, and a plurality of pixels P that are respectively formed in a plurality of areas defined by intersections of the gate lines GL and data lines DL.

Each of the pixels P may include a thin film transistor (TFT) connected to one gate line GL and one data line DL.

In the non-display area 104, the at least one or more gate driver ICs 200a for supplying a gate signal to the gate lines GL are bonded to the plastic panel 100 though the above-described bonding part 120, and moreover, the at least one or more data driver ICs 200b for supplying data signals synchronized with the gate signal to the data lines DL are bonded to the plastic panel 100 though the above-described bonding part 120.

The at least one gate driver IC 200a is bonded to the non-display area 104 of one side of the plastic panel 100 corresponding to one side of each of the gate lines GL, and sequentially supplies the gate signal to the gate lines GL. To this end, at least one or more bonding parts 120 are prepared in the non-display area 104 of one side of the plastic panel 100, and as described above, include the plurality of link patterns LP. The first and second test pads TP1 and TP2 are respectively connected to the first and second resistance patterns RP1 and RP2, respectively connected to the first and second link terminals LT1 and LT2 connected to each other through the internal resistor IR of the gate driver IC 220a, among the link patterns LP.

The at least one data driver IC 200b is bonded to the non-display area 104 of an upper side of the plastic panel 100 corresponding to one side of each of the data lines DL, and supplies data signals to the data lines DL. To this end, at least one or more bonding parts 120 are prepared in the non-display area 104 of one side of the plastic panel 100, and as described above, include the plurality of link patterns LP. The first and second test pads TP1 and TP2 are respectively connected to the first and second resistance patterns RP1 and RP2, respectively connected to the first and second link terminals LT1 and LT2 connected to each other through the internal resistor IR of the data driver IC 220b, among the link patterns LP.

The gate driver IC 200a and the data driver IC 200b are another example of the driving IC 200 which has been described above in the first embodiment, and the gate driver IC 200a and the data driver IC 200b are bonded to the bonding part 120 of the plastic panel 100 by the same method as the driving IC 200 that has been described above in the first embodiment. A bonding state therebetween may be determined with a resistance value measured by the first and second test pads TP1 and TP2.

In other words, after the gate driver IC 200a and the data driver IC 200b are bonded to the bonding part 120 of the plastic panel 100 by the squash of the conductive balls 420 identically to the first embodiment of the present invention, the FPD device according to the second embodiment of the present invention enables detection of a connection level between the gate driver IC 200a or the data driver IC 200b and the plastic panel 100 by using the resistance value measured by the first and second test pads TP1 and TP2.

Figure 10:
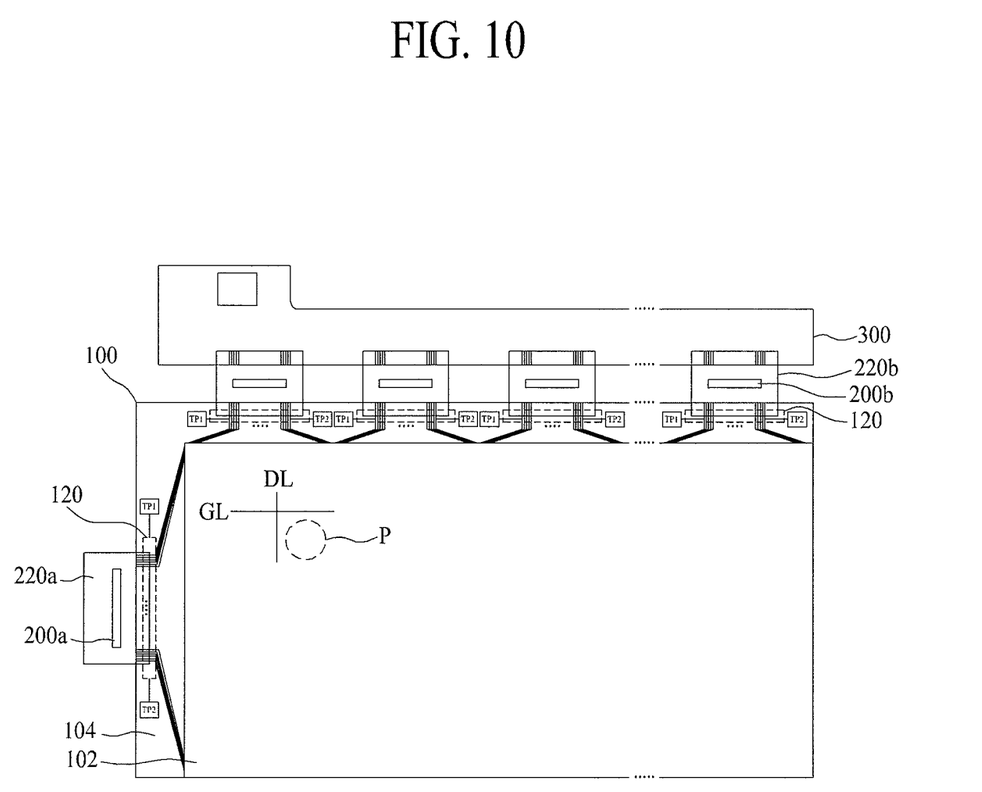
FIG. 10 is a view for schematically describing an FPD device according to a third embodiment of the present invention.

FIG. 10 is a view for schematically describing an FPD device according to a third embodiment of the present invention. In the following description, a description identical or similar to the first or second embodiment of the present invention described above with reference to FIGS. 3 to 9 is not provided or will only be briefly made.

The FPD device according to the third embodiment of the present invention includes a plastic panel 100, a circuit film 220a with a gate driver IC mounted thereon, a circuit film 220b with a data driver IC mounted thereon, and a PCB (main board) 300.

The plastic panel 100 includes a display area 102 that displays an image, and a non-display area 104 corresponding to an area other than the display area 102.

In the non-display area 104, at least one or more circuit films 220a, on which the gate driver IC 200a for supplying a gate signal to a plurality of gate lines GL are mounted, are bonded to the plastic panel 100 though a bonding part 120 having the above-described configuration.

At least one or more circuit films 220b with a data driver IC mounted thereon are bonded to the plastic panel 100 through the bonding part 120 provided in the non-display area 104 of one side of the plastic panel 100 corresponding to one side of each of a plurality of data lines DL, and supplies data signals, output from the data driver IC 200b, to the data lines DL.

A plurality of link terminals and at least one or more test terminals, which are provided in one side of the circuit film 220a with the gate driver IC mounted thereon or one side of the circuit film 220b with the data driver IC mounted thereon, as described above, are bonded to a plurality of link patterns LP provided in the bonding part 120, with a conductive member 400. The first and second test pads TP1 and TP2 are respectively connected to the first and second resistance patterns RP1 and RP2, respectively connected to the first and second link terminals LT1 and LT2 connected to each other through the internal resistor IR of the gate driver IC 220a or data driver IC 200b, among the link patterns LP.

The PCB 300 is electrically connected to the circuit film 220b with a plurality of data driver ICs mounted thereon by conductive balls of a conductive member (ACF) in a tape automated bonding (TAB) type. A timing control, etc., are mounted on the PCB 300. Therefore, the PCB 300 is equally called the main board.

The circuit film 220a with the gate driver IC mounted thereon and the circuit film 220b with the data driver IC mounted thereon are bonded to the bonding part 120 of the plastic panel 100 by the same method as the driving IC 200 that has been described above in the first embodiment.

After the circuit film 220a with the gate driver IC mounted thereon and the circuit film 220b with the data driver IC mounted thereon are bonded to the bonding part 120 of the plastic panel 100 by the squash of the conductive balls 420 identically to the first and second embodiments of the present invention, the FPD device according to the third embodiment of the present invention enables detection of a connection level between the circuit film 220a with the gate driver IC mounted thereon or the circuit film 220b with the data driver IC mounted thereon and the plastic panel 100 by using the resistance value measured by the first and second test pads TP1 and TP2.

As described above, the link pattern LP provided in the plastic panel according to the embodiment of the present invention may be bonded to the FPC 210 as well as the driving IC 200, and in addition to this, bonded to a circuit film (chip-on film (COF)) with the driving IC mounted thereon.

To provide additional description, FIG. 3 illustrates the FPD device according to the first embodiment of the present invention that includes the bonding part 120 in which the link pattern bonded to the driving IC 200 is provided. Also, although not shown in FIG. 3, a bonding part bonded to the FPC 210 may be provided. Especially, the driving IC 200 of FIG. 3 is the display driver IC (DDI) for applying electrical signals to the data lines and the gate lines. FIG. 9 illustrates the FPD device according to the second embodiment of the present invention in which the data driver IC and the gate driver IC are used as the driving IC 200. Also, FIG. 10 illustrates the FPD device according to the third embodiment of the present invention in which the circuit film with the data driver IC mounted thereon and the circuit film with a gate driver IC mounted thereon are adhered to the plastic panel 100 through the bonding part 120. Like the driving IC 200, the FPC 210, and the circuit film with the driving IC 200 mounted thereon, a generic name for elements adhered to the link pattern LP and the link pattern LP through the conductive member 400 is referred to as a driving element.

Moreover, the link pattern LP applied to the embodiment of the present invention is electrically connected by the conductive member (including a plurality of the conductive balls) to a link terminal provided in at least one of the driving IC 200, the FPC 210, and the circuit film 220 with the driving IC 200 mounted thereon, for supplying a certain signal to the link pattern. The first and second test pads TP1 and TP2 are respectively connected to the first and second resistance patterns RP1 and RP2, respectively connected to the first and second link terminals LT1 and LT2 connected to each other through the internal resistor IR of the driving element, among the link patterns LP. In embodiments of the present invention, the internal resistor IR of the driving element refers to an inherent resistance of the driving element. Accordingly, the internal resistor IR may vary based on the driving element that is used. The internal resistor IR provides a predetermined resistance. The internal resistor IR may be provided by a wire.

Accordingly, after the driving element is bonded to the bonding part of the plastic panel, a connection level between the driving element and the plastic panel may be determined with the resistance value measured by the first and second test pads TP1 and TP2.

The above-described embodiments of present invention will now be summarized briefly.

The embodiments of the present invention relate to a measurement structure for testing an indentation of the plastic panel 100, and provide a method for replacing a visual indentation testing method for plastic panels.

For example, in order to replace the existing method that visually checks a degree of indentation in a COG test for the plastic panel, the embodiment of the present invention configures some of a plurality of link patterns as the resistance patterns, and, by measuring a resistance value between the resistance patterns, determines whether the driving element is normally or correctly bonded to the plastic panel.

In embodiments of the present invention, the resistance patterns (the resistance pads) may be autoprobe pads, so that resistance patterns (the resistance pads) are normally off, but are used during an autoprobe process.

According to the embodiments of the present invention, since the two resistance patterns provided in the bonding part are connected to the two link terminals, which are electrically connected to each other through the internal resistor of the driving element bonded to the bonding part, and connected to the two test pads for resistance measurement, whether the driving element is normally or correctly bonded to the bonding part can be determined using resistance values measured through the two test pads.

Moreover, the embodiments of the present invention can determine a degree of indentation in the driving element bonded to the bonding part, by using a resistance value.

Accordingly, the embodiments of the present invention can shorten a tack time in manufacturing the plastic panel, enhance a yield rate, and facilitate detection of a defect.

It will be apparent to those skilled in the art that various modifications and variations can be made in the embodiments of the present invention without departing from the spirit or scope of the inventions. Thus, it is intended that the embodiments of the present invention cover the modifications and variations of this invention provided they come within the scope of the appended claims and their equivalents.

What is claimed is:

1. A flat display panel, comprising:
 a display area configured to display an image with a plurality of panel electrodes; and
 a non-display area, a plurality of link lines connected to the panel electrodes being provided in the non-display area, wherein,
 the display area and the non-display area are provided in a base substrate,
 a plurality of link pads, electrically connected to the link lines and a plurality of link terminals provided in a driving element, are provided in a bonding part adhered to the driving element in the non-display area,
 two resistance pads are respectively connected to two link terminals which are electrically connected to each other through the driving element, and
 at least two test pads are respectively connected to the two resistance pads.

2. The flat display panel of claim 1, wherein the link pads include the two resistance pads.

3. The flat display panel of claim 1, wherein the two resistance pads are not connected to the link lines.

4. The flat display panel of claim 1, where the two resistance pads are connected to data lines through switching elements.

5. The flat display panel of claim 1, wherein the base substrate is plastic.

6. The flat display panel of claim 1, wherein the driving element includes an internal resistor that provides a predetermined resistance.

7. The flat display panel of claim 6, wherein the internal resistor is a wire.

8. The flat display panel of claim 1, wherein each of the two test pads comprises:
- a test pad line provided in the base substrate, and branching from a link line connected to the two resistance pads; and
- a test pad transparent electrode connected to the test pad line through a test pad via hole which is formed in an insulating layer deposited on the test pad line.

9. The flat display panel of claim 8, wherein when a resistance measurement terminal contacts first and second test pads configuring the two test pads,
- a resistance is measured between a first test pattern, a first resistance pad of the two resistance pads connected to the first test pad, a second resistance pad of the two resistance pads electrically connected to the first resistance pads through an internal resistor of the driving element, and the second test pad connected to the second resistance pad.

10. The flat display panel of claim 1, wherein a first test pad of the two test pads is provided to branch from a first link line connected to a first resistance pad of the two resistance pads, and
- a second test pad of the two test pads is provided to branch from a second link line connected to a second resistance pad of the two resistance pads.

11. The flat display panel of claim 1, wherein the driving element is a driving IC.

12. A flat panel display device, comprising:
the flat display panel of claim 1; and
the driving element bonded to the bonding part provided in the flat display panel,
wherein,
the link terminals comprised in the driving element are connected to the link pads,
among the plurality of link terminals, the two link terminals connected to the two resistance pads are electrically connected to each other through an internal resistor of the driving element,
the driving element is a driving IC, and
the two test pads are provided in the flat display panel.

13. A flat panel display device, comprising:
the flat display panel of claim 1; and
the driving element bonded to the bonding part provided in the flat display panel,
wherein,
the link terminals comprised in the driving element are connected to the link pads,
among the plurality of link terminals, the two link terminals connected to the two resistance pads are electrically connected to each other through an internal resistor of the driving element,
the driving element is a driving IC, and
the two test pads are provided in a flexible printed circuit (FPC) electrically connected to the driving IC through the link lines.

14. A flat panel display device, comprising:
the flat display panel of claim 1; and
the driving element bonded to the bonding part provided in the flat display panel,
wherein,
the link terminals comprised in the driving element are connected to the link pads,
among the plurality of link terminals, the two link terminals connected to the two resistance pads are electrically connected to each other through an internal resistor of the driving element,
the driving element is a driving IC, and
the two test pads are provided in a printed circuit board (PCB) connected to a flexible printed circuit (FPC) which is electrically connected to the driving IC through the link lines.

15. A flat panel display device, comprising:
the flat display panel of claim 1; and
the driving element bonded to the bonding part provided in the flat display panel,
wherein,
the link terminals comprised in the driving element are connected to the link pads,
among the plurality of link terminals, the two link terminals connected to the two resistance pads are electrically connected to each other through an internal resistor of the driving element,
the driving element is a circuit film with a driving IC mounted thereon, and
the two test pads are provided in the non-display area of the flat display panel.

16. A flat panel display device, comprising:
the flat display panel of claim 1; and
the driving element bonded to the bonding part provided in the flat display panel,
wherein,
the link terminals comprised in the driving element are connected to the link pads,
among the plurality of link terminals, the two link terminals connected to the two resistance pads are electrically connected to each other through an internal resistor of the driving element,
the driving element is a flexible printed circuit (FPC) which is bonded to the bonding part at one side of the FPC and bonded to a printed circuit board (PCB) with a driving IC mounted thereon at the other side, and
the two test pads are provided in the non-display area of the flat display panel.

17. A flat display panel, comprising:
a plastic base substrate having a display area and a non-display area, the non-display area having a plurality of link lines,
wherein,
a plurality of link pads, electrically connected to the link lines and a plurality of link terminals provided in a driving element, are provided in a bonding part adhered to the driving element in the non-display area,
two resistance pads are respectively connected to two link terminals which are electrically connected to each other through the driving element, and
at least two test pads are respectively connected to the two resistance pads.

* * * * *